US012618920B2

(12) United States Patent
Motz

(10) Patent No.:     US 12,618,920 B2
(45) Date of Patent:          May 5, 2026

(54) RATIOMETRIC SENSOR CIRCUIT

(71) Applicant: Infineon Technologies AG, Neubiberg (DE)

(72) Inventor: Edwin Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 13 days.

(21) Appl. No.: 18/045,580

(22) Filed: Oct. 11, 2022

(65) Prior Publication Data

US 2023/0138691 A1     May 4, 2023

(30) Foreign Application Priority Data

Oct. 29, 2021    (DE) .......................... 102021128249.7

(51) Int. Cl.
H03F 3/393          (2006.01)
G01R 33/00          (2006.01)
G01R 33/07          (2006.01)

(52) U.S. Cl.
CPC ....... G01R 33/072 (2013.01); G01R 33/0023 (2013.01); H03F 3/393 (2013.01)

(58) Field of Classification Search
CPC .... G01R 33/07; G01R 33/072; G01R 33/075; G01R 33/077; G01R 33/09; G01R 33/091; G01R 33/093; G01R 33/095; G01R 33/096; G01R 33/098; G01R 33/0023; G01R 33/0082; G01D 5/142; G01D 5/145; G01D 5/147; G01D 5/16; G01D 5/165; H03F 3/393; H03F 3/45183; H03F 3/45475; H03F 2200/228; H03F 2200/261; H03F 2200/456; H03F 2203/45138
See application file for complete search history.

(56) References Cited

U.S. PATENT DOCUMENTS

| 6,362,618 B1 * | 3/2002 | Motz ...................... | G01R 33/07 |
| | | | 324/225 |
| 7,956,598 B2 * | 6/2011 | Ariyama ............ | H03K 17/9502 |
| | | | 324/252 |
| 2003/0030491 A1 * | 2/2003 | Hart ..................... | H03G 1/0088 |
| | | | 330/254 |
| 2008/0211574 A1 | 9/2008 | Denison | |
| 2010/0102878 A1 | 4/2010 | Nagata | |
| 2014/0145714 A1 * | 5/2014 | Okatake ............ | G01R 19/0092 |
| | | | 324/225 |
| 2015/0326197 A1 * | 11/2015 | Jayaraman ........... | H03G 1/0029 |
| | | | 330/254 |
| 2019/0025384 A1 * | 1/2019 | Iriguchi ............. | H03K 17/0822 |
| 2020/0083852 A1 * | 3/2020 | Guidry ............... | H03F 3/45197 |
| 2021/0275822 A1 * | 9/2021 | Shah .................... | A61N 1/3925 |

FOREIGN PATENT DOCUMENTS

| DE | 60217504 T2 | 11/2007 |
| EP | 2789983 A1 | 10/2014 |

OTHER PUBLICATIONS

Fan et al., "Capacitively-Coupled Chopper Amplifiers" Springer International Publishing, 2017, 129 pages.

* cited by examiner

*Primary Examiner* — David M Schindler
(74) *Attorney, Agent, or Firm* — Harrity & Harrity, LLP

(57)          ABSTRACT

The present disclosure relates to a sensor circuit including a control circuit configured to control a constant first signal to a ratiometric second signal using a first amplifier adjustable by an actuating signal, and an adjustable second amplifier for a sensor signal, the gain of which is adjustable by the actuating signal.

23 Claims, 5 Drawing Sheets

RATIOMETRIC SENSOR CIRCUIT

CROSS REFERENCE TO RELATED APPLICATION

This application claims priority to German Patent Application No. 102021128249.7 filed on Oct. 29, 2021, the content of which is incorporated by reference herein in its entirety.

TECHNICAL FIELD

The present disclosure relates generally to a sensor circuit and in particular to sensor circuits having a ratiometric behavior.

BACKGROUND

In electronics the term "ratiometric" means that an unknown variable can be derived from a known ratio of a plurality of other variables to one another. Generally, during a ratiometric measurement as a quotient to two variables with the same superposed disturbance, it turns out that the latter does not influence the measurement. A ratiometric measurement variable (such as e.g. a measured magnetic field strength) is for example independent of a supply voltage ($V_{DD}$) that may be subject to fluctuations. If the supply voltage rises unexpectedly at a measurement system, for example, a measurement signal coupled linearly to the supply voltage thus rises concomitantly. The variable to be measured has not changed, however. If the measurement signal were then passed to an ADC (Analog-to-converter) with a fixed reference voltage, the result would be that the ADC supplies a code that corresponds to a higher measurement variable—incorrect measurement—not a ratiometric system in this case. If the reference voltage of the ADC also concomitantly rose linearly with respect to the supply, the variable to be measured would not change at the output of the ADC—correct measurement—since a ratiometric system is present in this case. Ratiometric therefore means that if the measured signal changes as a result of a disturbance variable in the system, then the comparison variable must change in the same way, such that the change as it were "cancels out" and the change remains with "1/1". The measurement signal is then multiplied by this fraction. The ratiometric is perfect with 1, already poorer with 1.15, etc.

Sensor circuits having a fully ratiometric output (ratiometric sensor circuits) can be realized using digital signal processing, for example, but are relatively more expensive and slow. Ratiometric sensor circuits can for example also be realized using digitally assisted amplifiers having a digitally controlled gain. These do not have a problem with regard to speed, but are even more expensive. Sensors having a ratiometric quiescent voltage but a fixed sensitivity (=gain) avoid an analog multiplication by the supply voltage, but do not offer the functionality of a mechanical potentiometer and are not appropriate for a low-cost microprocessor (which receives the sensor signal) which uses the supply voltage as ADC reference (ADC=analog-to-digital converter). A sensor having a fixed sensitivity (gain) does not offer a complete ratiometric reaction.

Therefore, there is a need for improved ratiometric sensor circuits with at the same time manageable costs.

SUMMARY

This need is met by circuits and methods as claimed in the independent claims. The dependent claims relate to advantageous developments.

In accordance with a first aspect of the present disclosure, a sensor circuit is proposed which has a control circuit configured to control a constant first signal (e.g. constant current or constant voltage) to a ratiometric second signal (e.g. ratiometric current or ratiometric voltage) using a first amplifier adjustable by an actuating or control signal. The second signal is thus linearly coupled to a supply signal (e.g. supply voltage). The sensor circuit includes an adjustable second amplifier for a sensor signal, the gain of which is adjustable by the control signal of the control circuit. As a result, a ratiometric gain can be obtained at the second amplifier for the sensor signal. As a result, the gain of the second amplifier is likewise linearly coupled to the supply signal (e.g. supply voltage). With the proposed circuit arrangement, a ratiometric behavior can be attained with relatively simple and cost-effective amplifier designs.

In accordance with some example implementations, the first and second amplifiers are configured as replica amplifiers, e.g. as copies of one another. If for example the second amplifier for the sensor signal is regarded as the main amplifier, then the first amplifier can be configured as an exact copy of the main amplifier. However, the first amplifier of the control circuit does not amplify the sensor signal, but rather serves for adjusting the control signal for the (structurally identical) second amplifier. The term "amplifier" here does not necessarily mean just a single amplifier element (such as e.g. a transistor), but rather can mean a complete amplifier circuit which can have a plurality of circuit components, such as e.g. bipolar or MOS differential stages, cascodes, etc. The purpose behind using a replica amplifier may be that both amplifiers always behave identically even under varying ambient conditions. "Replica amplifiers" can be understood to mean not only amplifier circuits that are identical (within the scope of manufacturing tolerances), but also so-called scalable replica amplifiers. In the case of the latter, for example, a gain factor can differ between the two amplifiers (e.g. as a result of different emitter areas or source-drain channels), with an otherwise identical implementation.

In accordance with example implementations, the control circuit with the replica amplifier (replication amplifier) thus supplies a control signal which controls the gain of the sensor signal, such that an (amplified) output signal proportional to a supply voltage (ratiometric sensitivity=ratiometric gain) can be obtained. Technology-dependent fluctuations and temperature fluctuations of imprecise amplifiers can thus be compensated for.

In accordance with some example implementations, the sensor circuit is an integrated sensor circuit and the first and second amplifiers are formed on a common semiconductor substrate (or chip, die). Very exact replica circuits of main circuits can be produced in this way since both circuits are subject to the same production processes and production conditions.

In accordance with some example implementations, the sensor circuit includes a sensor configured for outputting the sensor signal in response to a physical measurement variable. The sensor can be embodied for example on the same semiconductor substrate as the other circuit components (e.g. first and second amplifiers) of the sensor circuit.

In accordance with some example implementations, the sensor includes a magnetic field sensor, such as, for example, a Hall sensor or a magnetoresistive sensor (xMR sensor). The Hall sensor can be configured for spinning current operation, for example. A Hall sensor includes one or more Hall effect sensor elements that measure a magnetic field strength and/or direction. These measurements are used to obtain parameters, such as, for example, distance, position and rotational speed. However, Hall sensor elements exhibit offsets at their outputs on account of mechanical loads, doping and geometric defects. Furthermore, Hall sensor elements exhibit an offset drift that results in an unpredictable and temporally variable output error. Such offsets in the case of Hall sensor elements can be reduced using the spinning current method, in which the bias current of a Hall sensor element is rotated spatially around the Hall sensor element, while the output signals are averaged over time. This can reduce an offset and an offset drift.

In accordance with some example implementations, the sensor circuit includes a reference voltage source configured to provide a reference voltage as the constant first signal. The reference voltage source can include a bandgap reference, for example. The term bandgap reference denotes a reference voltage source whose output voltage in a temperature-compensated state corresponds to the bandgap voltage of a semiconductor. The voltage generated thus varies depending on the semiconductor material. One particular property of a bandgap reference is a high precision in conjunction with low outlay in terms of circuitry. Moreover, bandgap references exhibit temperature stability and have a low terminal voltage ($<3$ volts).

In accordance with some example implementations, the sensor circuit includes a voltage divider connected between an external supply voltage and ground and configured to provide a ratiometric voltage as the second signal. The voltage divider is linearly coupled to the supply voltage, which may be subject to fluctuations. The voltage divider can be formed by electrical resistors, such that a voltage linearly coupled to the supply voltage is thereby obtained as a controlled variable for the control circuit.

In accordance with some example implementations, the first and second amplifiers each include a MOS differential stage (MOS=metal oxide semiconductor) having a first MOSFET and second MOSFET (MOSFET=Metal Oxide Semiconductor Field Effect Transistor). The source and drain currents of the MOSFETs are adjustable in each case by the control circuit. In predefined input and output voltages of the first (replica) amplifier, it is thus possible to adjust the gain thereof between input voltage and output voltage. It goes without saying that bipolar differential stages could also be used. Optionally, (folded) cascode structures can also be coupled to the outputs of the differential stages.

In accordance with some example implementations, the control circuit includes a transconductance amplifier having a first input for a first signal amplified using the first amplifier and a second input for the ratiometric second signal (e.g. voltage at a voltage divider), wherein the transconductance amplifier is configured to output the actuating signal at its output depending on a difference between the inputs. A transconductance amplifier is a special operational amplifier that converts the differential voltage at the two inputs into a proportional output current. Like other operational amplifiers it can usually be realized as an integrated circuit. Controlled current sources can then be driven via the output of the transconductance amplifier in order to adjust source and drain bias currents of the MOSFETs of the differential stages.

In accordance with some example implementations, the control circuit includes a comparator having a first input for a first signal amplified using the first amplifier and a second input for the ratiometric second signal and a charge pump coupled to an output of the comparator, wherein the comparator is configured to output the actuating signal at its output depending on a difference between the inputs. Using the actuating signal it is possible to drive the charge pump and via the latter in turn controlled current sources in order to adjust source and drain bias currents of the MOSFETs of the differential stages.

In accordance with some example implementations, the first and second amplifiers are each configured as a chopper amplifier. Chopper amplifiers are a type of amplifier in which a signal to be amplified is modulated (chopped), amplified and demodulated again. Use of such a technology makes it possible to shift a zero error (or offset error) and so-called 1/f noise of an amplifier into a frequency band which is not of interest. Such chopper amplifiers can be used for example in bandgap circuits which provide a defined reference voltage, but can likewise be used in other applications in which a signal is to be amplified, such as, for example, for amplifying measurement signals.

In accordance with some example implementations, the first and/or the second (chopper) amplifier can each have at least one capacitively coupled chopper demodulator in order to further smooth a chopper ripple. In the case of a capacitively coupled chopper demodulator, an output of an amplifier can be coupled to a downstream amplifier stage via one or more capacitances in order thereby to smooth a chopper ripple. In this case, the capacitances can be switched directly into the signal path between output of the amplifier and input of the downstream amplifier stage and/or between the signal path and ground.

In accordance with some example implementations, a feedback loop having switched capacitors can be coupled to an output at least of the second amplifier (main amplifier), and feeds back a chopper ripple. A chopper ripple can be smoothed as a result. By virtue of a feedback loop having switched capacitors, the discharge resistances can be realized by switched capacitances (referred to as switched capacitors). The term switched capacitor filters, or often also just SC filters for short, denotes electronic filters in which ohmic resistors are replaced by switched capacitors. They are time-discrete filters. The filter parameters of the SC filters can be altered very easily by varying the switching frequency $f_s$ with which the capacitances are switched over. The replacement of the ohmic resistances R in a given circuit, such as a low-pass filter, by capacitances $C_S$ which are operated with the switchover frequency $f_s$ can be calculated in accordance with $R=1/f_sC_S$. It will be apparent to the person skilled in the art that the switching frequency $f_s$ of the capacitances need not correspond to the chopper frequency $f_{chop}$.

In accordance with a further aspect of the present disclosure, a method for operating a sensor circuit is proposed, including controlling a constant first signal to a ratiometric second signal using a first amplifier adjustable by an actuating or control signal, and adjusting a gain of an adjustable second amplifier for a sensor signal based on the actuating signal.

In accordance with some example implementations, the first and second amplifiers are operated as identical or scaled replica amplifiers.

BRIEF DESCRIPTION OF THE DRAWINGS

Some examples of devices and/or methods are explained in greater detail; merely by way of example below with reference to the accompanying figures, in which.

DETAILED DESCRIPTION

Some examples will now be described more thoroughly with reference to the accompanying figures. However, further possible examples are not restricted to the features of these implementations described in detail. These may have modifications of the features and counterparts and alternatives to the features. Furthermore, the terminology used herein for describing specific examples is not intended to be limiting for further possible examples.

Throughout the description of the figures, identical or similar reference signs refer to identical or similar elements or features which can be implemented in each case identically or else in modified form, while they provide the same or a similar function. In the figures, furthermore, the thicknesses of lines, layers and/or regions may be exaggerated for the purpose of clarity.

If two elements A and B are combined using an "or" this should be understood such that all possible combinations are disclosed, e.g. only A, only B and A and B, unless expressly defined otherwise in an individual case. As alternative wording for the same combinations, it is possible to use "at least one from A and B" or "A and/or B". That applies equivalently to combinations of more than two elements.

If a singular form, e.g. "a", "an" and "the", is used and the use of only a single element is defined neither explicitly nor implicitly as obligatory, further examples can also use a plurality of elements in order to implement the same function. If a function is described below as being implemented using a plurality of elements, further example can implement the same function using a single element or a single processing entity. Furthermore, it goes without saying that the terms "comprises", "comprising", "has" and/or "having" in their usage describe the presence of the specified features, integers, steps, operations, processors, elements, components and/or a group thereof, but do not exclude the presence or the addition of one or more other features, integers, steps, operations, processors, elements, component and/or a group thereof.

The concept of a ratiometric sensor circuit proposed herein has, in principle, numerous possibilities for use in various electrical and/or electronic circuits. Therefore, the circuit concept disclosed herein is initially explained very generally with reference to FIGS. 1 and 2.

Figures 1, 2:
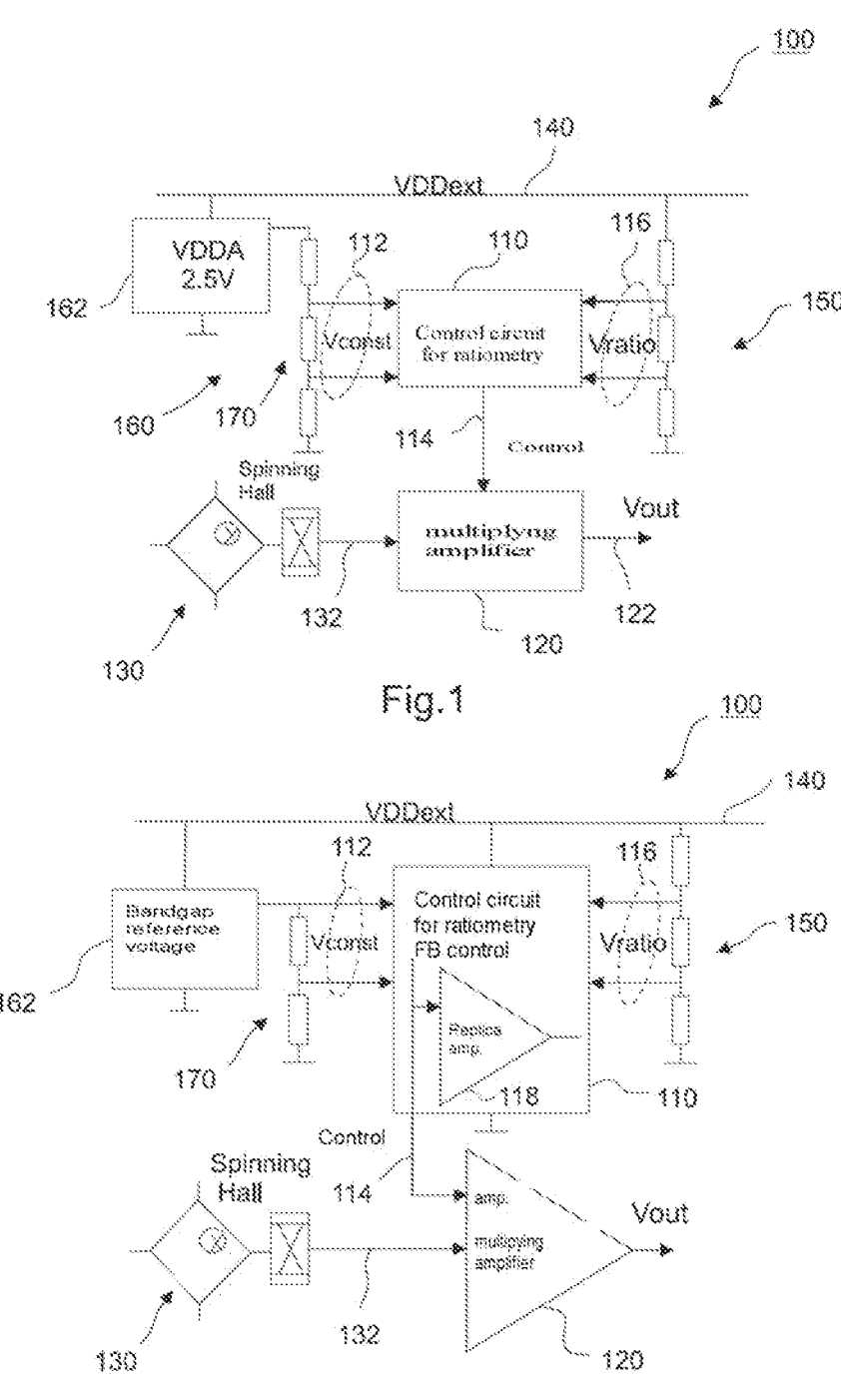
FIG. 1 shows a block diagram of a ratiometric sensor circuit in accordance with one example implementation.
FIG. 2 shows a further block diagram of a ratiometric sensor circuit in accordance with one example implementation.

FIG. 1 shows a basic illustration of a sensor circuit 100 in accordance with one example implementation.

The sensor circuit 100 comprises a control circuit 110 configured to control a constant first signal 112, such as e.g. a constant voltage, to a ratiometric second signal 116, such as e.g. a ratiometric voltage, using a first amplifier (not shown) adjustable by an actuating or controlled signal 114. The sensor circuit 100 additionally comprises an adjustable second amplifier 120 for a sensor signal 132, the gain of which is adjustable by the actuating signal 114 of the control circuit 110.

The control circuit 110 thus controls the gain $V_1$ of the first amplifier (not shown) in accordance with a ratio between the ratiometric second signal 116 ($V_{ratio}$) and the constant first signal 112 ($V_{const}$), e.g. $V_1 = V_{ratio}/V_{const}$. In this case, the ratiometric second signal 116 is linearly dependent on a supply signal 140, such as e.g. an external supply voltage $V_{DD,ext}$. The supply signal 140 can be subject to fluctuations and thus for example also ratiometrically influence the sensor signal 132. The ratiometric second signal 116 can correspond to the supply voltage $V_{DD,ext}$ 140 itself, or a signal dependent thereon. In the example shown in FIG. 1, the sensor circuit comprises a voltage divider 150 connected between the external supply voltage 140 and ground and configured to provide the ratiometric voltage $V_{ratio}$ as the second signal 116, to which the control circuit 110 effects control. The voltage divider 150 here comprises by way of example three electrical resistors connected in series, the ratiometric voltage $V_{ratio}$ being tapped off at terminals of a middle resistor. It goes without saying that the voltage divider 150 could also be configured differently, for example with only two or more than three resistors.

The sensor circuit 100 shown in FIG. 1 comprises a reference voltage source 160 configured to provide the control circuit 110 with a constant reference voltage $V_{const}$ as the first signal 112. For this purpose, the reference voltage source 160 can comprise a bandgap reference 162, which in the example shown is connected between the supply signal 140 and ground. A further voltage divider 170 can be provided between an output of the bandgap reference 162 and ground, and is configured to provide the constant reference voltage $V_{const}$ as the second signal 116 based on the bandgap voltage at the output of the bandgap reference 162. It goes without saying that, in other implementations, the bandgap voltage of the bandgap reference 162 could also be used directly as the first signal 112 and the voltage divider 170 could thus be obviated. The voltage divider 170 here comprises by way of example three electrical resistors connected in series, the constant reference voltage $V_{const}$ being tapped off at terminals of a middle resistor of the voltage divider 170. It goes without saying that the voltage divider 170 could also be configured differently, for example with only two or more than three resistors.

The actuating or control signal 114 for adjusting the gain of the first amplifier (not shown in FIG. 1) is equally fed to the second amplifier 120 for amplifying the sensor signal 132, such that the gain $V_2$ thereof likewise behaves in a ratiometric manner (e.g. in a linearly dependent manner with respect to the supply signal 140). With a ratiometric sensor signal and a ratiometric gain $V_2$, a fully ratiometric system is thus obtained. As sensor 130, FIG. 1 shows by way of example a Hall sensor for measuring a magnetic field. A Hall voltage which is caused by the magnetic field and which behaves in a ratiometric manner is amplified using the second amplifier to form an output signal 122. Since the gain $V_2$ of the second amplifier 120 is likewise ratiometric, a fully ratiometric measurement system is obtained. It goes without saying that the present disclosure is not restricted to Hall sensors, but rather is applicable to any sensors. In this regard, for example, other magnetic field sensors, such as e.g. magnetoresistive sensors (AMR, GMR, TMR), or capacitive sensors, inductive sensors, etc., could be used as sensors 130. In this case, the sensors 130 can have for example a ratiometric quiescent voltage which is linearly dependent on the signal 140.

The first amplifier of the control circuit 110 and the second amplifier 120 for the sensor signal 132 can be configured as identical or scalable replica amplifiers. That is indicated in FIG. 2, which schematically illustrates the first amplifier 118 in the control loop 110. The first amplifier 118 is configured as a replica (copy) of the second amplifier 120, or vice versa. That means that both amplifiers 118, 120 are constructed substantially identically and thus also behave correspondingly identically. That means that for both amplifiers 118, 120 the actuating signal 114 leads to the same (ratiometric) gain ($V_1=V_2$). For this purpose, it is possible to implement the two amplifiers 118, 120 with identical circuit structures jointly on a semiconductor chip. A virtually identical behavior can thus be ensured. Besides the two amplifiers 118, 120, it is also possible to integrate even more or all circuit components of the sensor circuit 100 as an integrated circuit jointly on the semiconductor chip.

Figure 3:
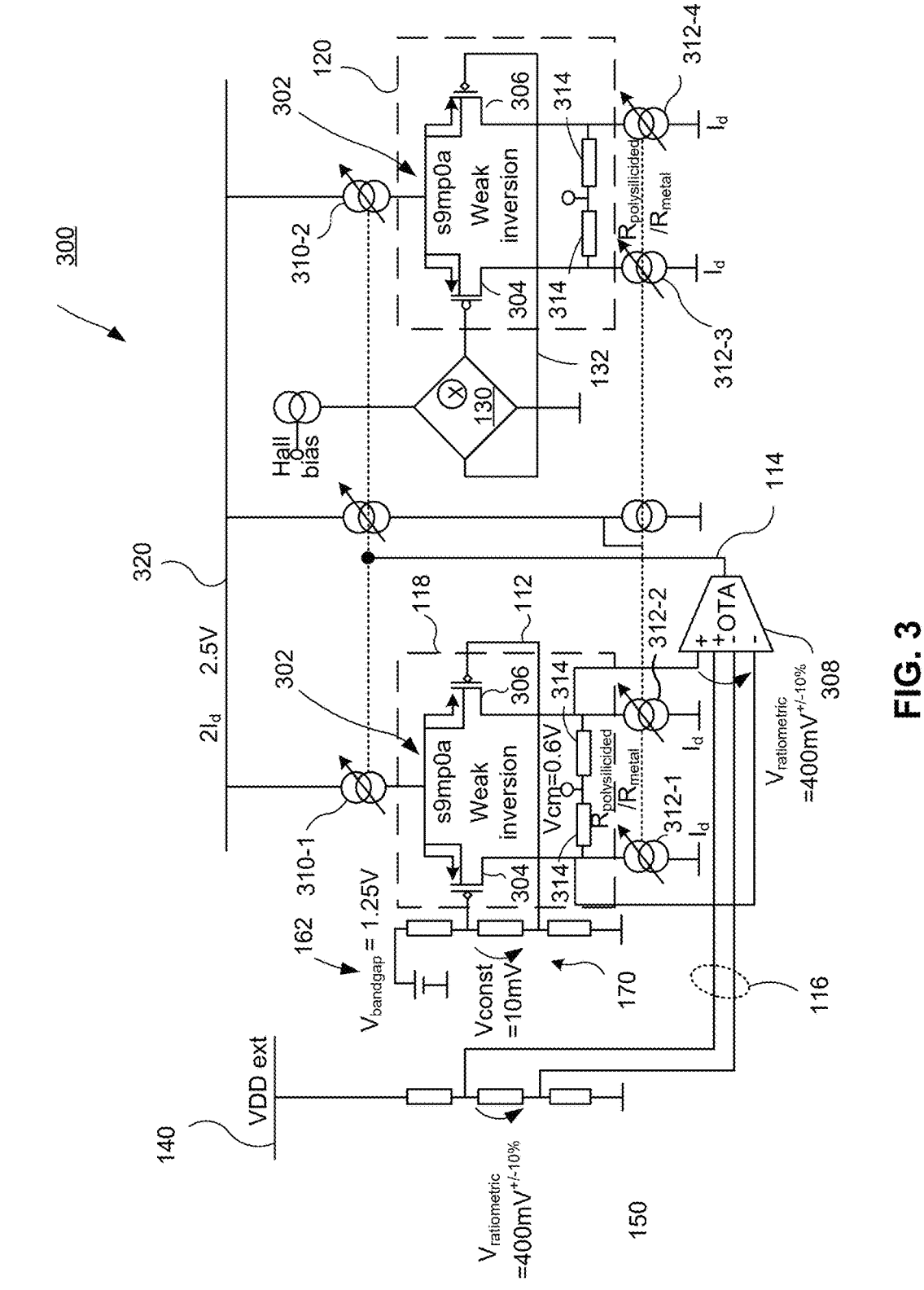
FIG. 3 shows one example implementation of an integrated ratiometric sensor circuit comprising MOS differential stages.

One example implementation of the sensor circuit 100 is shown in FIG. 3.

The integrated sensor circuit 300 in FIG. 3 has a left circuit portion and a right circuit portion on a common semiconductor substrate (die). The left circuit portion comprises the control circuit 110 with replica amplifier 118, and the right circuit portion comprises Hall sensor 130 together with main amplifier 120 for the sensor signal 132. Replica amplifier 118 and main amplifier 120 are embodied identically (within the scope of manufacturing tolerances), that is to say have identical transistors, for example. Replica amplifier 118 and main amplifier 120 each have a MOS differential stage 302 having in each case a first MOSFET 304 and a second MOSFET 306 and having source and drain bias currents of the MOSFETs 304, 306 that are adjustable in each case by the control circuit 110. For this purpose, a current source 310-1 controllable using the control circuit 110 is coupled to the integrated source terminal of the MOSFET 304 and a current source 310-2 controllable using the control circuit 110 is coupled to the integrated source terminal of the MOSFET 306. Furthermore, a current source 312-1 controllable using the control circuit 110 is coupled to the drain terminal of the MOSFET 304 and a current source 312-2 controllable using the control circuit 110 is coupled to the drain terminal of the MOSFET 306. The MOS differential stages 302 respectively form differential amplifiers 118 and 120 having a respective differential input at the gates of the MOSFETs 304, 306 and a respective differential output at the drain terminals of the MOSFETs 304, 306.

In the example shown in FIG. 3, the control circuit 110 has a transconductance amplifier 308 having a first (differential) input for a (differential) output signal of the replica amplifier 118 and having a second (differential) input for the (differential) ratiometric setpoint signal 116 from the voltage divider 150 coupled between $VDD_{ext}$ and ground. The differential output signal amplified by the replica amplifier 118 can be tapped off between the drain terminals of the PMOSFETs 304, 306. The transconductance amplifier 308 is configured to output at its output the actuating signal (control current) 114 depending on the difference between the (differential) transconductance amplifier inputs.

Using the actuating signal (control current) 114 and one or more current mirrors arranged between the left and right circuit portions, the respective controlled current sources 310-1, 310-2, 312-1, 312-2, 312-3, and 312-4 can be driven in both circuit portions, the current sources adjusting source and drain currents of the respective MOSFETs 304, 306 of the MOS differential stages 302 such that a difference between the (differential) inputs of the transconductance amplifier 308 becomes (substantially) zero. That in turn then means that the output voltage of the replica amplifier 118 adjusted by the control circuit 110 corresponds to the ratiometric setpoint voltage 116. The controlled current sources 310-1, 310-2, are each coupled between a supply potential 320 and source terminals of the respective MOSFETs 304, 306 of the amplifiers 118, 120. The gate terminals of the MOSFETs 304, 306 of the replica amplifier 118 form a differential input for the constant reference voltage 112. The gate terminals of the MOSFETs 304, 306 of the main amplifier 120 form a differential input for the differential sensor signal 132. Controlled current sources 312-1, 312-2, 312-3, 312-4 are in each case coupled between the drain terminals of the respective MOSFETs 304, 306 and ground, and are coupled to the actuating signal (control current) 114 via a current mirror. Consequently, both amplifiers 118, 120 are ratiometrically controlled identically by way of the control circuit 110.

Optionally, a common-mode output signal can be obtained between the drain terminals of the MOSFETs 304, 306 of the respective MOS differential stages 302. For this purpose, a voltage divider having two identical resistors 314 can be connected between the drain terminals of the respective MOSFETs 304, 306. The resistors 314 can be embodied as silicided polysilicon resistors (poly-resistors), for example. It is assumed here that the integrated sensor circuit 300 or at least parts thereof are embodied using complementary metal oxide semiconductor technology (CMOS). Integrated circuits (ICs) often require integrated resistors for proper operation of the circuit. Such resistors generally consist of doped polycrystalline silicon. In order to reduce the resistances in the poly-resistors, a metal silicide layer can be formed over the doped polycrystalline silicon or the formation of such a layer over the doped polycrystalline silicon can be prevented. This option of the metal silicide layer enables two different types of resistors composed of polycrystalline silicon. The first type with the metal silicide layer over the doped polycrystalline silicon is referred to as "silicided polycrystalline silicon resistor" (silicided poly-resistor), and the electrical conduction of this resistor is effected via the metal silicide layer. The second type without the metal silicide layer over the doped polycrystalline silicon is referred to as "non-silicided polycrystalline silicon resistor" (non-silicided poly-resistor). In the case of the second type, the electrical conduction is effected through the polycrystalline silicon, which depends on the doping (p- or n-doped) of the polycrystalline silicon. The temperature coefficient of the resistance of silicided polysilicon resistors is similar to that of metal resistors.

Although FIG. 3 shows the integrated sensor circuit 300 comprising MOS differential stages 302, it goes without saying that other implementations of this concept are also possible, such as using bipolar differential stages, for example, in which analogously respective emitter and collector bias currents for adjusting a gain can then be controlled using the control circuit 110.

Figure 4:
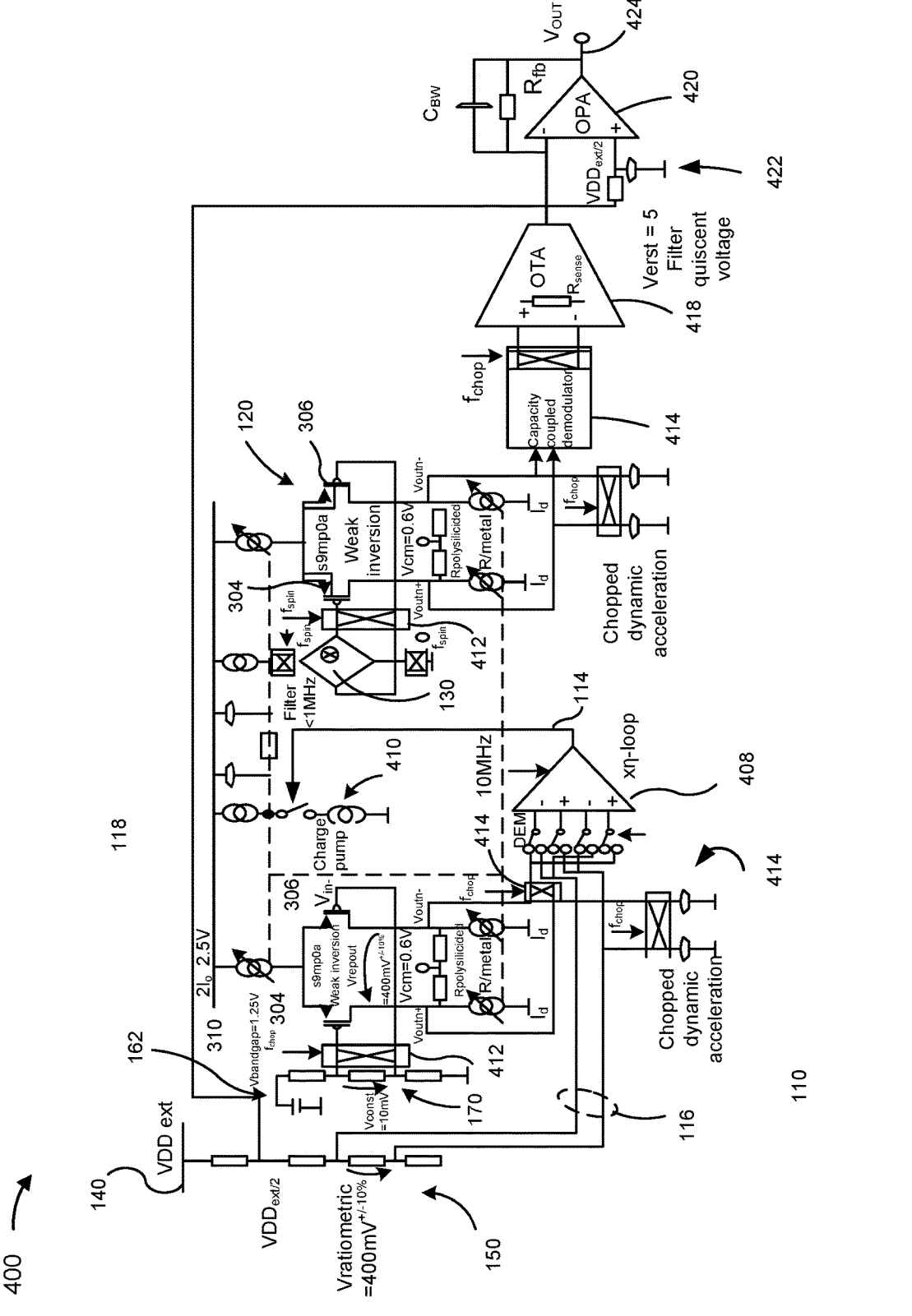
FIG. 4 shows a further example implementation of an integrated ratiometric sensor circuit comprising chopper amplifiers.

A further example implementation of the sensor circuit 100 is shown in FIG. 4.

The integrated sensor circuit 400 in FIG. 4 differs from the integrated sensor circuit 300 in FIG. 3 for example in that the control circuit 110 in the left circuit portion comprises, instead of the transconductance amplifier 308, a comparator 408 having a first (differential) input for a (differential) output signal amplified using a replica amplifier 118 and having a second (differential) input for the (differential)

ratiometric setpoint signal 116 from the voltage divider 150 coupled between $VDD_{ext}$ and ground. An output signal of the comparator 408 acts as an actuating signal 114 and controls a charge pump 410 coupled to the output of the comparator 408. By way of the charge pump 410, the controlled current sources 310, 312 can in turn be driven, and adjust source and drain currents of the respective MOSFETs 304, 306 of the MOS differential stages 302 such that the difference between the (differential) inputs of the comparator 408 becomes zero. It goes without saying that comparator 408 and charge pump 410 could also be used in the example implementation in FIG. 3.

As a further difference with respect to FIG. 3, in the example implementation in FIG. 4, both replica amplifiers 118, 120 are operated as so-called chopper amplifiers. FIG. 4 thus shows a control loop 110 for chopped replica amplifiers 118 and chopped sensor amplifier 120 for the compensation of a dynamic gain reducing effect of chopped amplifiers and with comparator 408 and charge pump 410 in the control loop 110 for providing a control signal 114 for current sources 310, 312 (which controls the gain of the amplifiers). Both amplifier circuits 118, 120 each comprise a modulator circuit 412 at the input of the respective amplifier, the modulator circuit being switched with a chopper frequency $f_{chop}$ and being configured to convert a respective DC input voltage (DC=Direct Current) into an AC input voltage (AC=Alternating Current), e.g. an AC voltage, in accordance with the chopper frequency. In the case of the amplifier 118, the input voltage is the constant voltage $V_{const}$. In the case of the amplifier 120, the input voltage is the Hall voltage 132. Both amplifier circuits 118, 120 each furthermore comprise, at the output of the respective modulator circuit 412, the MOS differential stage 302 having a differential input for the AC input voltage and having a differential output (drain terminals of the MOSFETs 304, 306) for an amplified AC voltage. Both amplifier circuits 118, 120 furthermore comprise, at the output of the MOS differential stage 302, a demodulator circuit 414, switched with the chopper frequency $f_{chop}$ and configured to convert the amplified AC voltage back into an amplified DC voltage.

The respective demodulated circuits 414 can be configured during different switching phases to couple each of the inverting and noninverting outputs of the amplifier circuit 118 and/or 120 capacitively (e.g. using capacitances) to each inverting and noninverting input of a differential amplifier 408 or 418 connected downstream. For this purpose, capacitances can be provided directly in the respective signal paths and/or be connected between the respective signal paths and ground. Such capacitively coupled demodulated circuits 414 enable a chopper ripple present at the output of the chopper amplifier circuit 118, 120 to be reduced further by comparison with conventional (non-capacitively coupled) chopper amplifier circuits. The term chopper ripple denotes offset voltages that are amplified by the amplifier circuit and demodulated by the demodulator circuit 414. A conventional demodulation of an offset DC voltage then results in an undesired AC voltage (chopper ripple). The proposed capacitively coupled implementation and functioning of the demodulator circuits 414 can reduce the chopper ripple. Capacitively coupled chopper amplifier circuits are described for example in Qinwen Fan, Kofi A. A. Makinwa, Johan H. Huij sing: "Capacitively-Coupled Chopper Amplifiers", Springer International Publishing, 2017.!

A capacitively coupled demodulator circuit 414 can be of interest in particular at the output of the main or measurement amplifier 120 for the sensor signal 132 of the Hall sensor 130. In the example implementation illustrated, the Hall sensor 130 is operated in a so-called spinning current mode with a spinning frequency $f_s$. During a first switching phase of the Hall sensor 130, a first current flows via two first out of four terminals of the Hall sensor 130, such that a first Hall voltage can be tapped off at the other two terminals. During a succeeding second switching phase, a second current flows via the other two terminals, such that a second Hall voltage can be tapped off at the first terminals, etc. It goes without saying that example implementations of the present disclosure can also be operated with other signal sources which can be combined with chopper amplifiers. A frequency $f_s$ of the switching phases of the spinning current mode of the Hall sensor 130 preferably corresponds to the chopper frequency $f_{chop}$ of the modulator circuits 412 and demodulator circuits 414.

A differential output of the demodulator circuit 414 coupled to the measurement amplifier 120 can be fed for example to a transconductance amplifier 418 connected downstream, the output of which is in turn fed to an inverting input of an operational amplifier 420 connected downstream. A noninverting input of the operational amplifier 420 is coupled to the external supply signal 140 via a low-pass filter 422 and the voltage divider 150. An overall amplifier ratiometric measurement signal 424 can be tapped off at the output of the operational amplifier 420.

Figure 5:
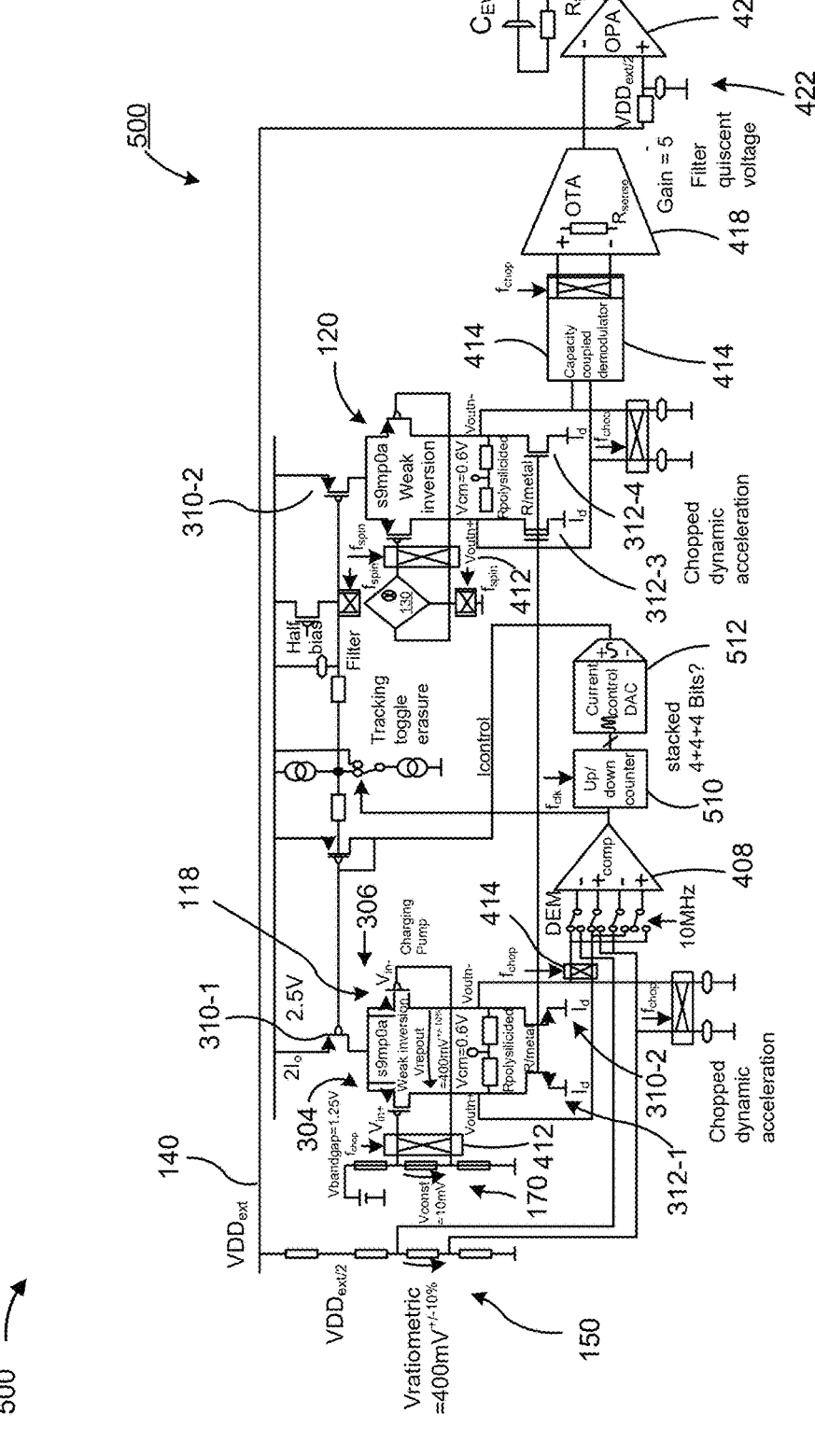
FIG. 5 shows a further example implementation of an integrated ratiometric sensor circuit comprising chopper amplifiers.

A further example implementation of the sensor circuit 100 is shown in FIG. 5. The integrated sensor circuit 500 in FIG. 5 differs from the integrated sensor circuit 400 in FIG. 4 in that an up/down counter or digital integrator 510 and a DAC 512 are coupled to the output of the comparator 408 in order to supply a control signal for the controlled current sources 310, 312.

Figure 6:
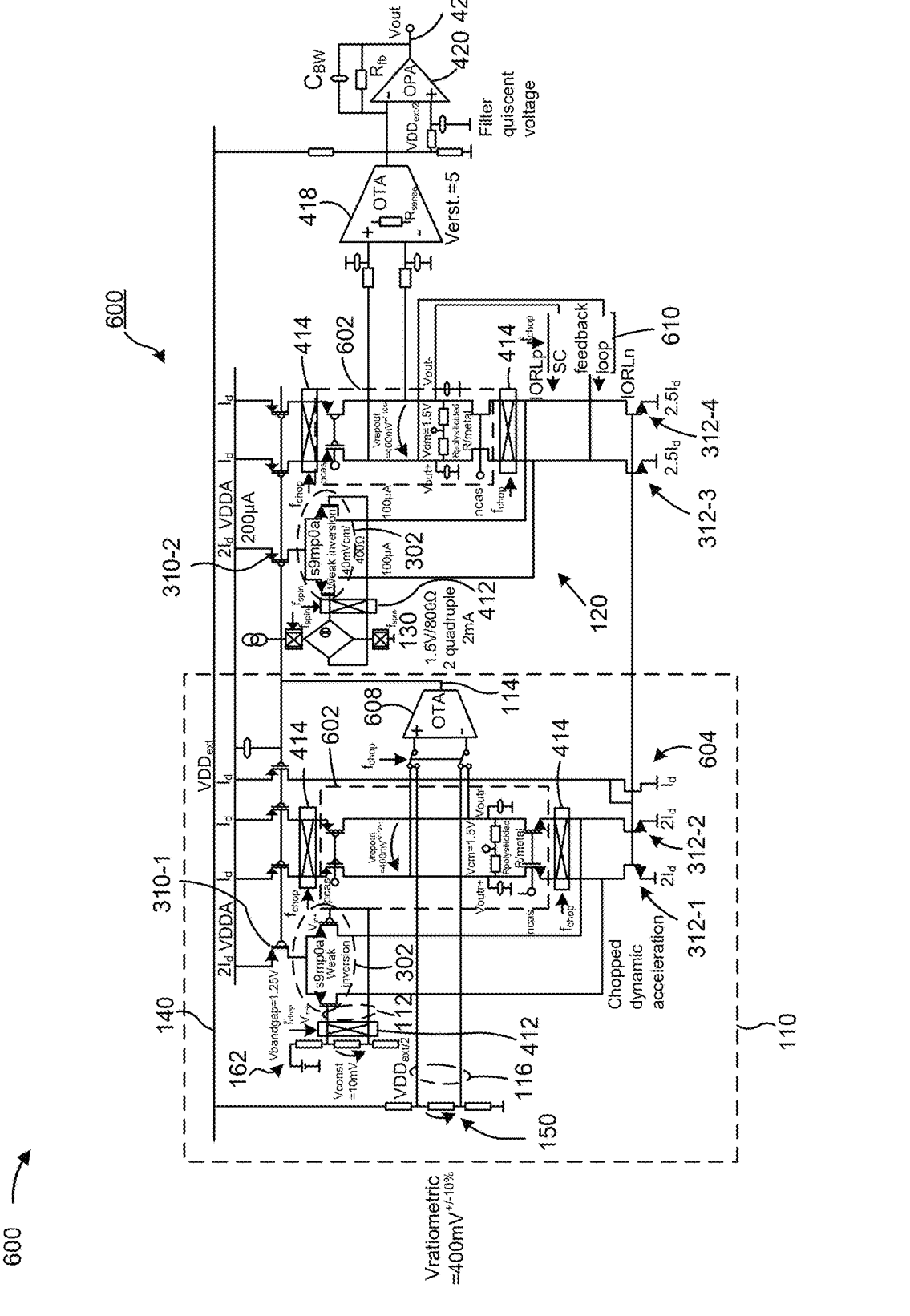
FIG. 6 shows a further example implementation of an integrated ratiometric sensor circuit comprising chopper amplifiers and a feedback loop having switched capacitors for suppressing the chopper ripple.

FIG. 6 shows an implementation of an integrated ratiometric sensor circuit 600 in which, in the manner similar to FIGS. 4 and 5, the amplifiers 118 and 120 are likewise configured as chopper amplifiers, that is to say each have at least one modulator circuit 412 at the input and at least one demodulator circuit 414 at the output of the respective amplifier. In addition, in accordance with the example implementation in FIG. 6, the two (identical) amplifiers 118, 120 have folded cascodes in each case. Each amplifier 118 and 120 is a folded cascode having a MOS differential stage 302 and a cascode pair 602 (as designated by the dotted line) at the output of the MOS differential stage 302.

With the chopper frequency $f_{chop}$, inverting and noninverting components of the ratiometric setpoint signal 116 and of an output signal of the folded cascode (amplifier) 118 are alternately fed to a differential input of a transconductance amplifier 608 in order to output the actuating or control signal 114 for the controlled current sources 310, 312. The control current sources 310 here control source bias currents of the respective MOS differential stages 302 and source bias currents of the respective cascode pair 602. The controlled current sources 312 here control drain bias currents of the respective cascode pair 602. In the case of the switch position shown in FIG. 6 at the transconductance amplifier 608, the lower line (signal component) of the ratiometric setpoint signal 116 is applied to the inverting input of the transconductance amplifier 608 while the left line (signal component) of the output signal of the folded cascode (amplifier) 118 is applied to the noninverting input of the transconductance amplifier 608. In the next chopper switching phase, the upper line (signal component) of the ratiometric setpoint signal 116 is applied to the noninverting input of the transconductance amplifier 608, while the right line (signal component) of the output signal of the folded cascode (amplifier) 118 is applied to the inverting input of the transconductance amplifier 608. The source and drain bias currents adjusted by way of the control loop 110 are distributed via current mirrors 604 in order to set the same gain in each case for both amplifiers (folded cascodes) 118 and 120.

An optional feedback loop 610 is arranged between an output of the main amplifier (folded cascode) 120 and a transconductance amplifier 418 connected downstream, and can feed back the chopper ripple (instead of a largely capacitively coupled chopper demodulator). To put it more precisely, the SC feedback loop 610 can be coupled between an input of the cascode pair 602 (or an output of the MOS differential stage 302) and an output of the cascode pair 602 of the main amplifier 120. In the SC feedback loop 610, one or more capacitances can be connected between the respective signal line and ground with a switchover frequency $f_s$ for each of the differential signal paths.

The circuit arrangement in FIG. 6 makes it possible to attain at the output 424 a larger dynamic range (even higher gain possible) and more latitude for common-mode levels. The chopping is effected among the cascodes 602, which is generally faster. Large output resistances with their parasitic capacitances are no longer situated in the chopper loop, but rather still in the gain loop.

In accordance with example implementations, the control loop 110 compares a fixed input voltage 112 (e.g. derived from a bandgap circuit or the internal supply of the sensor) with a divided external supply voltage VDDext (which is ratiometric with respect to VDDext) 116 and thus controls the gain of the sensor amplifier. The gain of the replica amplifier 118 is controlled by the comparison of the fixed input signal 112 with the divided VDDext voltage 116 and adjusts the gain of the replica amplifier 118 and of the sensor amplifier 120. As a result, technology-dependent fluctuations and temperature fluctuations of imprecise amplifiers can be compensated for. Furthermore, the dynamic effects of chopping (gain reduction effects) can be compensated for.

The aspects and features which have been described in association with a specific one of the examples above can also be combined with one or more of the further examples in order to replace an identical or similar feature of this further example or in order additionally to introduce the feature into the further example.

It furthermore goes without saying that the disclosure of a plurality of steps, processes, operations or functions disclosed in the description or the claims should not be interpreted as being mandatorily in the order described, unless this is explicitly indicated or absolutely necessary for technical reasons in an individual case. Therefore, the preceding description does not limit the implementation of a plurality of steps or functions to a specific order. Furthermore, in further examples, an individual step, an individual function, an individual process or an individual operation can include a plurality of partial steps, partial functions, partial processes or partial operations and/or be subdivided into them.

Where some aspects in the preceding sections have been described in association with a device or a system, these aspects should also be understood as a description of the corresponding method. In this case, for example, a block, a device or a functional aspect of the device or of the system can correspond to a feature, for instance a method step, of the corresponding method. Analogously thereto, aspects described in association with a method should also be understood as a description of a corresponding block, a corresponding element, a property or a functional feature of a corresponding device or a corresponding system.

The claims that follow are hereby incorporated in the detailed description, where each claim can be representative of a separate example by itself. Furthermore, it should be taken into consideration that—although a dependent claim refers in the claims to a specific combination with one or more other claims—other examples can also encompass a combination of the dependent claim with the subject of any other dependent or independent claim. Such combinations are hereby explicitly proposed, provided that in an individual case no indication is given that a specific combination is not intended. Furthermore, features of a claim are also intended to be included for any other independent claim, even if this claim is not directly defined as being dependent on this other independent claim.

What is claimed is:

1. A sensor circuit, comprising:

a first voltage divider configured to provide a constant first signal as a first differential signal based on a constant voltage source, the first differential signal comprising a first pair of signals representative of a constant first voltage difference;

a second voltage divider configured to provide a ratiometric second signal as a second differential signal based on an external supply, the second differential signal comprising a second pair of signals representative of a second voltage difference;

a control circuit including a first amplifier, the control circuit configured to control a ratio of the constant first signal to the ratiometric second signal using a differential output of the first amplifier, a first gain of the first amplifier being adjustable by an actuating signal that is different from the constant first signal, the first amplifier comprising a first Metal Oxide Semiconductor (MOS) differential stage that includes a first Metal Oxide Semiconductor Field Effect Transistor (MOSFET) and a second MOSFET, wherein a first current source is coupled to integrated source terminals of the first MOSFET and the second MOSFET of the first MOS differential stage; and an adjustable second amplifier for amplifying a sensor signal, the adjustable second amplifier including a second MOS differential stage corresponding to the first MOS differential stage, and a second gain of the adjustable second amplifier being adjustable by the actuating signal, wherein a second current source is coupled to integrated source terminals of a first MOSFET and a second MOSFET of the second MOS differential stage, wherein the control circuit is configured to:

generate the actuating signal based on the ratio, adjust the actuating signal in response to a change in the ratio, and control, based on a current value of the actuating signal, the first current source to adjust source currents of the first MOSFET and the second MOSFET of the first MOS differential stage in order to adjust the first gain, and control, based on the current value of the actuating signal, the second current source to adjust source currents of the first MOSFET and the second MOSFET of the second MOS differential stage in order to adjust the second gain.

2. The sensor circuit as claimed in claim 1, wherein the sensor circuit is configured to receive a supply signal from the external supply, and wherein the first gain of the first amplifier and the second gain of the adjustable second amplifier have a same ratiometric gain that is linearly dependent on the supply signal.

3. The sensor circuit as claimed in claim 1, wherein the sensor circuit is an integrated sensor circuit and the first amplifier and the adjustable second amplifier have substantially identical circuit structures that are formed on a common semiconductor substrate of the integrated sensor circuit.

4. The sensor circuit as claimed in claim 1, further comprising:
a sensor, configured for outputting the sensor signal in response to a physical measurement variable, wherein the sensor is configured to be supplied by a supply signal from the external supply such that the sensor signal is linearly dependent on the supply signal.

5. The sensor circuit as claimed in claim 1, further comprising the constant voltage source, wherein the constant voltage source is a reference voltage source configured to provide a reference voltage as the constant first signal.

6. The sensor circuit as claimed in claim 5, wherein the reference voltage source comprises a bandgap reference.

7. The sensor circuit as claimed in claim 5, wherein the sensor circuit is configured to receive a supply signal from an external supply,
wherein the reference voltage source and a sensor that provides the sensor signal are supplied by the supply signal, and
the ratiometric second signal is linearly dependent on the supply signal.

8. The sensor circuit as claimed in claim 1, wherein the first voltage divider is configured to be connected between an external supply voltage of the external supply and a ground, and configured to provide a ratiometric voltage as the ratiometric second signal.

9. The sensor circuit as claimed in claim 1, wherein the control circuit comprises a transconductance amplifier having a first input for the constant first signal amplified using the first amplifier and a second input for the ratiometric second signal, and
wherein the transconductance amplifier is configured to output the actuating signal at an output of the transconductance amplifier based on a difference between the constant first signal and the ratiometric second signal.

10. The sensor circuit as claimed in claim 1, wherein the first amplifier is configured to generate an amplifier output signal based on the constant first signal, and
the control circuit is configured to generate the actuating signal based on a difference between the amplifier output signal and the ratiometric second signal.

11. The sensor circuit as claimed in claim 10, wherein the control circuit is configured to generate the actuating signal to drive the difference between the amplifier output signal and the ratiometric second signal to substantially zero.

12. The sensor circuit as claimed in claim 10, wherein the control circuit is configured to control the first current source and the second current source based on the current value of the actuating signal to drive the difference between the amplifier output signal and the ratiometric second signal to substantially zero.

13. The sensor circuit as claimed in claim 10, wherein the first amplifier is a first differential amplifier,
wherein the adjustable second amplifier is a second differential amplifier, and
wherein the amplifier output signal is a differential output signal comprising a pair of output signals.

14. The sensor circuit as claimed in claim 13, further comprising:
a transconductance amplifier configured to receive the amplifier output signal at a first differential input and the second differential signal at a second differential input, and generate the actuating signal.

15. The sensor circuit as claimed in claim 1, wherein the sensor circuit is configured to receive a supply signal from an external supply, and
wherein the sensor signal is linearly dependent on a supply signal.

16. The sensor circuit as claimed in claim 1,
wherein the control circuit comprises a transconductance amplifier comprising:
a first differential input configured to receive the differential output from the first amplifier, the differential output comprising a pair of output signals;
a second differential input configured to receive the second pair of signals of the ratiometric second signal; and
an output configured to output the actuating signal, and
wherein the transconductance amplifier is configured to generate and adjust the actuating signal based on a difference between the differential output and the ratiometric second signal.

17. The sensor circuit as claimed in claim 16, wherein the differential output is dependent on the constant first signal.

18. The sensor circuit as claimed in claim 16, wherein the first amplifier is configured to receive the constant first signal, and generate the differential output based on the constant first signal.

19. The sensor circuit as claimed in claim 18, wherein the first pair of signals includes a first signal and a second signal,
wherein the first MOSFET of the first MOS differential stage includes a first gate configured to receive the first signal, and
wherein the second MOSFET of the first MOS differential stage includes a second gate configured to receive the second signal.

20. A method for operating a sensor circuit, comprising
providing, by a first voltage divider, a constant first signal as a first differential signal based on a constant voltage source, the first differential signal comprising a first pair of signals representative of a constant first voltage difference;
providing, by a second voltage divider, a ratiometric second signal as a second differential signal based on an external supply, the second differential signal comprising a second pair of signals representative of a second voltage difference;
controlling, by a control circuit, a ratio of the constant first signal to the ratiometric second signal using a differential output of a first amplifier of the control circuit, a first gain of the first amplifier being adjustable by an actuating signal that is different from the constant first signal, the first amplifier comprising a first Metal Oxide Semiconductor (MOS) differential stage that includes a first Metal Oxide Semiconductor Field Effect Transistor (MOSFET) and a second MOSFET, wherein a first current source is coupled to integrated source terminals of the first MOSFET and the second MOSFET of the first MOS differential stage;
generating, by the control circuit, the actuating signal based on the ratio;
adjusting, by the control circuit, the actuating signal in response to a change in the ratio;

adjusting the first gain of the first amplifier by controlling, based on an adjustment to the actuating signal, the first current source to adjust source currents of the first MOSFET and the second MOSFET of the first MOS differential stage; and adjusting a second gain of an adjustable second amplifier based on the adjustment to the actuating signal, the adjustable second amplifier being configured to amplify a sensor signal, the adjustable second amplifier including a second MOS differential stage corresponding to the first MOS differential stage, wherein a second current source is coupled to integrated source terminals of a first MOSFET and a second MOSFET of the second MOS differential stage, and wherein adjusting the second gain of the adjustable second amplifier includes controlling, based on the adjustment to the actuating signal, the second current source to adjust source currents of the first MOSFET and the second MOSFET of the second MOS differential stage.

21. The method as claimed in claim 20, further comprising:

operating the first amplifier and the adjustable second amplifier as identical amplifiers having a same gain or as scaled replica amplifiers having different gains.

22. The method as claimed in claim 20, further comprising:

receiving, by the sensor circuit, a supply signal from an external supply, wherein the first gain of the first amplifier and the second gain of the adjustable second amplifier have a same ratiometric gain that is linearly dependent on the supply signal.

23. A sensor circuit, comprising:

a first voltage divider configured to provide a constant first signal as a first differential signal based on a constant voltage, the first differential signal comprising a first pair of signals representative of a constant first voltage difference;

a second voltage divider configured to provide a ratiometric second signal as a second differential signal based on a supply voltage, the second differential signal comprising a second pair of signals representative of a second voltage difference;

a first amplifier;

a control circuit configured to receive the constant first signal, receive the ratiometric second signal that is dependent on the supply voltage, and generate an actuating signal based on a ratio of the constant first signal and the ratiometric second signal, wherein the control circuit is configured to adjust the actuating signal in response to a change in the ratio of the constant first signal and the ratiometric second signal, and wherein the first amplifier has a first gain being adjustable based on the actuating signal;

an adjustable second amplifier configured to amplify a sensor signal according to a second gain to generate an output signal, the second gain being adjustable based on the actuating signal such that the second gain is dependent on the supply voltage;

a first current source coupled to the first amplifier, wherein the first current source is configured to adjust currents of the first amplifier based on a current value of the actuating signal in order to adjust the first gain; and a second current source coupled to the adjustable second amplifier, wherein the second current source is configured to adjust currents of the adjustable second amplifier based on the current value of the actuating signal in order to adjust the second gain.

* * * * *